United States Patent [19]

Nishitoba et al.

[11] Patent Number: 4,469,082
[45] Date of Patent: Sep. 4, 1984

[54] PULSE WIDTH CONTROL CIRCUIT IN WHICH A FEEDBACK AMOUNT IS VARIED DEPENDING UPON AN OPERATING TEMPERATURE

[75] Inventors: Shigeo Nishitoba; Hirokazu Fukaya, both of Tokyo, Japan

[73] Assignee: Nippon Electric Co., Ltd., Tokyo, Japan

[21] Appl. No.: 388,302

[22] Filed: Jun. 14, 1982

[30] Foreign Application Priority Data

Jun. 12, 1981 [JP] Japan ................................. 56-90239

[51] Int. Cl.³ .............................................. F02P 9/00
[52] U.S. Cl. .................................... 123/609; 123/625; 123/644; 307/265; 307/310; 307/359
[58] Field of Search ............... 123/609, 625, 626, 644, 123/613; 307/359, 310, 265

[56] References Cited

U.S. PATENT DOCUMENTS

| | | | |
|---|---|---|---|
| 3,314,407 | 4/1967 | Schneider | 307/359 |
| 3,605,713 | 9/1971 | Le Masters et al. | 123/625 |
| 3,841,288 | 10/1974 | Korteling | 123/609 |
| 4,059,083 | 11/1977 | Habert | 123/613 |
| 4,167,927 | 9/1979 | Mikami et al. | 123/609 |
| 4,267,813 | 5/1981 | Hohne et al. | 123/625 |
| 4,350,904 | 9/1982 | Cordell | 307/310 |

FOREIGN PATENT DOCUMENTS

45-4924  2/1970  Japan .................................. 123/625

*Primary Examiner*—Andrew M. Dolinar
*Attorney, Agent, or Firm*—Sughrue, Mion, Zinn, Macpeak & Seas

[57] ABSTRACT

An ignition coil control circuit compares the coil input current with a reference level, and the duty ratio of the output current is altered accordingly. The reference level is raised during cold weather operations, raising the duty ratio. Once the operating temperature of the engine rises above a predetermined level, a detector circuit activates a control signal generator which lowers the reference level received by the comparator to lower the duty ratio accordingly.

11 Claims, 29 Drawing Figures

PULSE WIDTH CONTROL CIRCUIT IN WHICH A FEEDBACK AMOUNT IS VARIED DEPENDING UPON AN OPERATING TEMPERATURE

BACKGROUND OF THE INVENTION

The present invention relates to a pulse width control circuit for controlling an output pulse width in response to a periodic input signal by means of a feedback loop, and more particularly to a pulse width control circuit available in a solid state ignition system for an internal combustion engine of an automobile.

In an ignition system for an internal combustion engine, it is necessary to supply sufficient ignition energy to an ignition coil over the entire speed range of the internal combustion engine (i.e. from a low rotation speed to a high rotation speed). Both the timing and duration of ignition energy supplied to the ignition coil are controlled by making use of a signal synchronized with the rotation of the internal combustion engine. Specifically upon the low engine speed rotation, cycle period of the synchronized signal is long; while upon high speed operation the cycle period of the synchronized signal is short. In addition, the ignition coil is an inductive load such that a current flows through the ignition coil with a time constant determined by the inductance and resistance of the ignition coil. In view of the aforementioned operating conditions, it is thus necessary to select the period for supplying a current to the ignition coil to be short with respect to a cycle period of the input signal upon low speed rotation, and to be long with respect to a cycle period of the input signal upon high speed rotation. The absolute value of the current suppling period to the ignition coil is nearly equal upon the low speed operation and upon the high speed operation.

For this purpose, the ignition system for an internal combustion engine typically includes a pulse width control circuit for controlling the pulse width of an output pulse in response to an input signal by means of a feedback loop. The pulse width control circuit in the ignition system produces a pulse drive signal for supplying a current to an ignition coil by making use of both an input signal synchronized with the rotation of the internal combustion engine and a comparison output signal obtained by comparing a sawtooth signal derived from the input signal with a reference level. The pulse drive signal consists of a current supply start point and a current supply period. A current flowing through the ignition coil is detected, and the detected output is fed back to change the reference level. In other words, a feedback loop is provided. By this feedback loop, the abovementioned reference level is varied depending upon the rotational speed of internal combustion engine, and a pulse drive signal corresponding to the rotational speed is thereby obtained.

However, since the pulse drive signal is produced by making use of the sawtooth signal derived from the input signal as described above, the amplitude level of the sawtooth signal influences the pulse width and the start point of the pulse drive signal. The amplitude level of the sawtooth signal is determined by a duty ratio of the input signal, and the duty ratio of the input signal is in turn determined by the rotation mode of the internal combustion engine. Where the internal combustion engine is started when the outside temperature is low as in a severe winter, smooth rotation of the engine cannot be obtained due to the high viscosity of engine oil. For this reason, the duty ratio of the input signal under these conditions varies, and hence the amplitude level of the sawtooth signal will become too large. Consequently, it often occurs that the comparison output cannot be derived, and the pulse drive signal for supplying a current to the ignition coil thus cannot be produced.

Hence, it has been proposed to vary the reference level so that the comparison output may be obtained even when the sawtooth signal has an abnormal amplitude level. However, when the viscosity of the engine oil decreases due to the temperature increase caused by the continuous operation of the engine, or when the outside temperature rises, an input signal having the predetermined duty ratio will be obtained. Further, the reference level will remain at the level established in response to the sawtooth signal having the abnormal amplitude level. Consequently, the pulse width of the pulse drive signal for the ignition coil will become too large, and the current supply period to the ignition coil will become unnecessarily long. Since the ignition system is additionally provided with a current limiting capability for limiting a peak value of the supply current to the ignition coil, the breakdowns of circuit elements such as transistors due to an excessively large current will not typically occur. However, in some cases, thermal breakdowns of the driving transistors caused by heat generation therein may possibly occur due to this overly long current supply period. When it is intended to prevent the thermal breakdown in the solid state ignition system by relying upon a heat capacity and a heat dissipation characteristic of an equipped capsule, the thermal design of semiconductor devices such as transistors which operate below their capable junction temperatures would be accompanied by a great deal of difficulty. Moreover, taking into consideration the great range of operating temperatures of the internal combustion engine, this design difficulty is increased even further. In addition, as a matter of course, the electric power consumption is also very high.

SUMMARY OF THE INVENTION

It is thus one object of the present invention to provide a pulse width control circuit which both prevents the misfiring of an output pulse signal caused by abnormal signal input, and generates an output signal having a predetermined pulse width in response to normal signal input.

Another object of the present invention is to provide an ignition system which can supply desired ignition energy to an ignition coil over the entire operation ranges of an internal combustion engine (i.e. from a low temperature to a high temperature, and from a low rotation speed to a high rotation speed).

A pulse width control circuit according to the present invention comprises an integrator circuit for producing a sawtooth signal from a periodic input signal, a comparator circuit for comparing the sawtooth signal with a comparison level (or a reference level), means for providing a drive signal by making use of an output of the comparator circuit and the input signal, an output circuit for supplying a current to a load in response to the drive signal thereto, a feedback circuit for varying the comparison level provided between the output circuit and the comparator circuit, a detector circuit for detecting an operating temperature, and circuit means responsive to detection output of a predetermined operating temperature from the detector circuit for varying the comparison level.

A considerable change of the duty ratio of an input signal will occur at very low temperatures of the viscosity (i.e. when engine oil is high). When the temperature then rises due to the continuous operation of the internal combustion engine, the viscosity of the engine oil becomes moderate, and an input signal having a predetermined duty ratio can now be obtained. Therefore, when the detector circuit detects the fact that the operating temperature has risen to such a temperature that the smooth rotation can be obtained, the detector circuit will generate a detection output. In response to the detection output, the comparison level is varied. Prior to the occurrence of the detection output, the comparison level is set at such a level that an output of the comparator circuit can be obtained even in response to the input signal having an abnormal duty ratio. When the detection output has been generated, the comparison level is varied to obtain a predetermined comparison output in response to the input signal having a normal duty ratio. Accordingly, the current supply to a load (i.e. the ignition coil) over an unnecessarily long period is prevented. As a result, the reduction of electric power consumption and the prevention of thermal breakdown of semiconductor devices can be achieved. In addition, due to the feedback circuit provided between the output circuit and the comparator circuit, a desired drive signal can be obtained over the entire operation range from a low rotational speed to a high rotational speed.

BRIEF DESCRIPTION OF THE DRAWINGS

The objects, advantages and features of the present invention will be more apparent from the following descriptions taken in conjunction with the accompanying drawings, wherein.

DETAILED DESCRIPTION OF THE PRIOR ART

Figure 1:
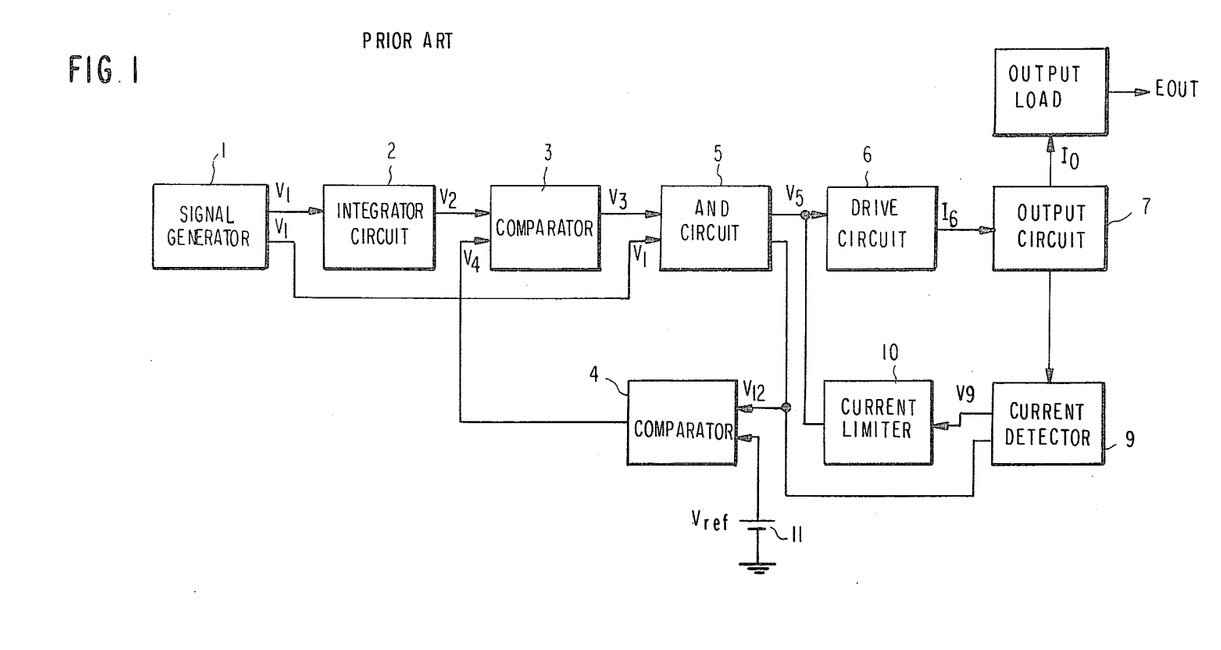
FIG. 1 is a block diagram showing an ignition system for an internal combustion engine in the prior art which employs a pulse width control circuit.

Referring now to FIGS. 1 and 2, description will first be made of an ignition system for an internal combustion engine of the prior art. A signal generator 1 includes a hole sensor (not shown) contained in a distributor (not shown) and it generates a pulse output $V_1$ (FIG. 2A) synchronized with the rotational speed of an internal combustion engine (not shown) by making use of the hole sensor. This pulse output $V_1$ is converted by an integrator circuit 2 into a sawtooth signal $V_2$ (FIG. 2B). This sawtooth signal $V_2$ is applied to one input of a comparator 3 which has another input from a comparison level signal $V_4$ having a waveform close to a D.C. voltage that is supplied from a comparator 4. Consequently, pulse output signal $V_3$ as shown in FIG. 2C is obtained at the output of comparator 3. More particularly, the output signal $V_3$ of the comparator 3 takes a low level when the sawtooth signal $V_2$ from the integrator circuit 2 is higher than the comparison level signal $V_4$ from the comparator 4, whereas it takes a high level when the former is lower than the latter. A logical product of the pulse output $V_1$ generated by the signal generator 1 and the pulse output $V_3$ derived from the comparator 3 is produced by an AND circuit 5. As a result, an output pulse $V_5$ issued from the AND circuit 5 (FIG. 2D) has a rising edge coincident in time with the rising edge of the output pulse $V_3$ from the comparator 3 and a falling edge coinicdent in time with the falling edge of the output pulse $V_1$ from the signal generator 1. An output circuit 7 is driven via a drive circuit 6 by the output signal $V_5$. For the purpose of facilitating explanation, it is assumed that a waveform $I_6$ as shown in FIG. 2E represents a drive current fed from the drive circuit 6 for driving the output circuit 7. An output load 8 for the output circuit 7 is an inductive load such as an ignition coil. Accordingly, by the conduction of the output circuit 7, an output current $I_0$ as shown in FIG. 2F through the output circuit 7 will increase gradually with a time constant $L_1/R_1$ determined by an inductance $L_1$ and a resistance $R_1$ of the output load (ignition coil) 8.

Figure 2A:
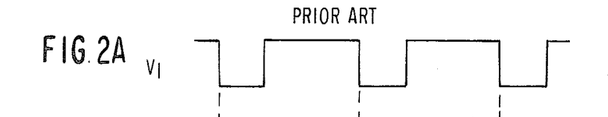
FIG. 2A to FIG. 2I are signal waveform diagrams to be used for explaining the operation of the system shown in FIG. 1.
Figure 2B:
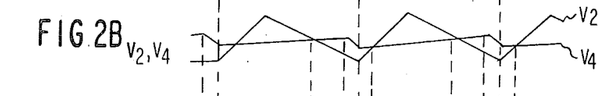
Figure 2C:
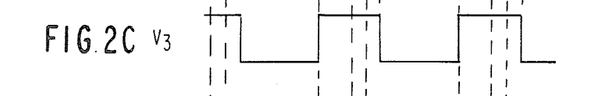
Figure 2D:
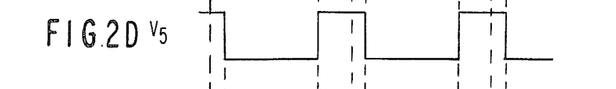
Figure 2E:
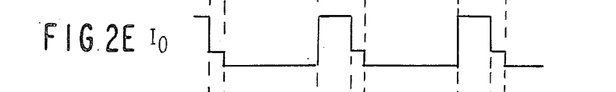
Figure 2F:
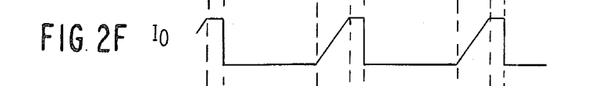
Figure 2G:
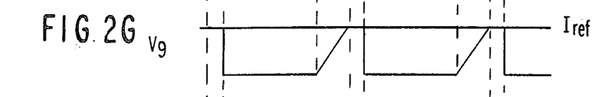
Figure 2H:
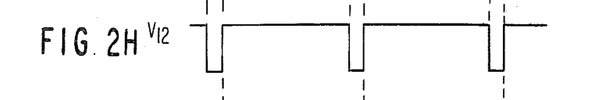
Figure 2I:
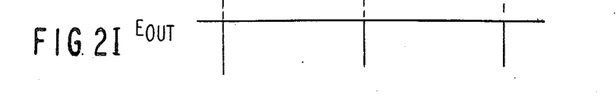

The value of the output current $I_0$ is detected by a current detector circuit 9. When the output current value reaches a predetermined reference value $I_{ref}$ (as shown in FIG. 2G), the current detector circuit 9 applies a detection signal $V_9$ to a current limiter circuit 10. The current limiter circuit 10 reduces the drive current $I_6$ (FIG. 2E) of the drive circuit 6. As a result, the output current $I_0$ from the output circuit 7 will not increase larger than a predetermined reference value $I_{ref}$ (as shown by the upper limit of $I_0$ in FIG. 2F). The energy $E_{out}$ generated at the secondary winding of the output load 8 obtained by the current interruption in the output circuit 7 will serve as ignition energy (FIG. 2I) for an ignition plug (not shown).

In addition, when the current detector circuit 9 senses that the output current $I_0$ has reached the predetermined reference value $I_{ref}$ (hereinafter, this state being called current limiting state), the current detector circuit 9 applies a low level output to the comparator 4. When the output circuit 7 is in a cut-off state, that is, when the current detector circuit 9 stops its detecting operation, a high level signal is applied from the AND circuit 5 to the comparator 4. Accordingly, one input of the comparator 4 receives a pulse signal $V_{12}$ (FIG. 2H) which takes a low level only under a current limiting state. The other input of the comparator 4 is applied with a reference voltage $V_{ref}$ supplied from a reference voltage source 11. The comparator 4 compares these input signals. While the output waveform $V_4$ of the comparator 4 was described previously to be a waveform close to a D.C. voltage, in practice it is a charging- /discharging wave form produced as a result of the charging of a capacitor. The capacitor is charged when the output waveform from the current detector circuit 9 is high and is discharged when the same output waveform is low. The level of this output voltage $V_4$ from the comparator 4 is regulated so as to match the current rotation speed of the internal combustion engine. More particularly, when the rotation speed is low, the cycle period of the pulse waveform $V_1$ derived from the hole sensor is long. At this time, a small pulse width as compared to the cycle period of the pulse waveform $V_1$ is required for the output current $I_0$ to reach the predetermined reference value, and therefore, the output voltage level $V_4$ of the comparator 4 is lowered to reduce the flowing period of the output current $I_0$. On the other hand, when the rotational speed is high, the cycle period of the pulse waveform $V_1$ derived from the hole sensor is short, so that the time constant on the primary side of the ignition coil of the load 8 becomes close to the cycle period of the pulse signal $V_1$. In this case, the output level $V_4$ of the comparator 4 is increased to enlarge the flow period of the output current $I_0$ relative to the input signal cycle. Thus, the flow period of the output current $I_0$ is regulated depending upon the cycle period of the input signal by employing negative feedback. In this manner, the output current $I_0$ of the output circuit 7 may take a predetermined reference value and also the current limiting period may be minimized. Such a system, in which a certain cycle is taken as a reference and control is effected on the premise that an input pulse width is not varied in the next cycle, is called a predictive control system.

Figure 3A:
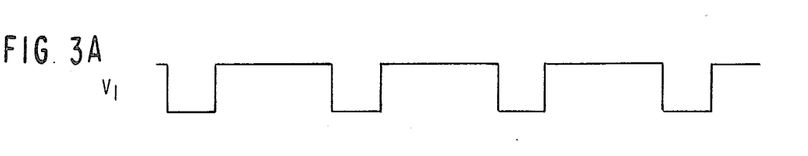
FIGS. 3A and 3B are signal waveform diagrams showing a normal input signal and an abnormal input signal, respectively.
Figure 3B:
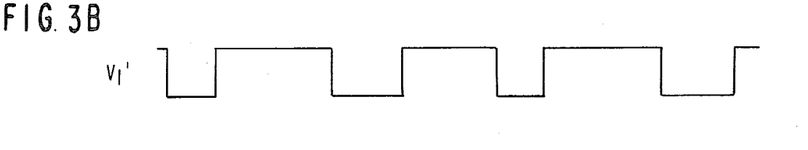

In an internal combustion engine, when the operating temperature is low such as in a severe winter, smoothness in rotation is lost due to the high viscosity of engine oil. For this reason, in a system wherein the rotation speed of an engine is detected by making use of the hole sensor as shown in FIG. 1, upon the low speed rotation (a rotational speed of 500 to 800 r.p.m.), the duty ratio of an output waveform from the hole sensor cannot be kept constant. However, an abnormal waveform $V_1'$ as shown in FIG. 3B may be derived occasionally. For instance, a waveform having its duty ratio increasing or decreasing in alternate cycles may possibly occur. A normal waveform $V_1$ having a substantially constant duty ratio is shown in FIG. 3A.

When such an abnormal waveform $V_1'$ constitutes the input to the circuit shown in FIG. 1, the following problem may arise. That is, in the event that the duty ratio of the input waveform $V_1'$ is irregular such that the proportion of a low level is increased as shown in a time interval I in FIG. 4A, the charging period in the integrator circuit 2 is increased, whereas the discharging period is decreased. For this reason, the amplitude level of the sawtooth voltage $V_2$ is increased considerably, such that in the discharging period (time interval II in FIG. 4B) of the output $V_2$ from the integrator circuit 2, the discharging voltage has a higher level than the output waveform $V_4$ of the comparator 4. Consequently, the output $V_3$ from the comparator 3 is not obtained, resulting in that the output signal $V_5$ and the output current $I_0$ are not produced, as shown in FIGS. 4C and 4D. Thus, a current pulse will not be generated when it is needed (this condition being referred to hereinafter as "occurrence of a missing pulse"). Such a state is inherent in the operation of the predictive control system of the prior art. That is, since the level of the output signal $V_4$ from the comparator 4 is determined on the basis of the output signal $V_4$ in the preceding cycle, the level of the output signal $V_4$ cannot be varied in the time interval I of the input waveform $V_1$. The occurrence of a missing pulse means that ignition energy is not supplied to the ignition plug of the internal combustion engine.

Figure 4A:
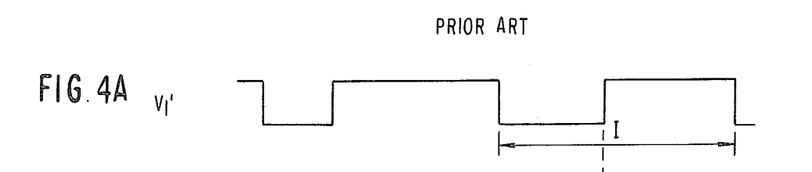
FIG. 4A to FIG. 4D are signal waveform diagrams showing signal waveforms obtained in the ignition system in FIG. 1 when the abnormal input signal shown in FIG. 3 is applied to the system.
Figures 4B, 4C:
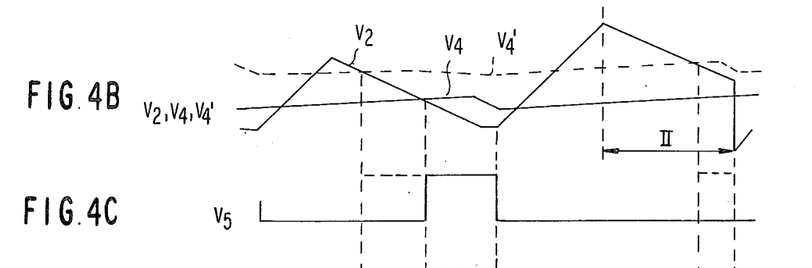
Figure 4D:
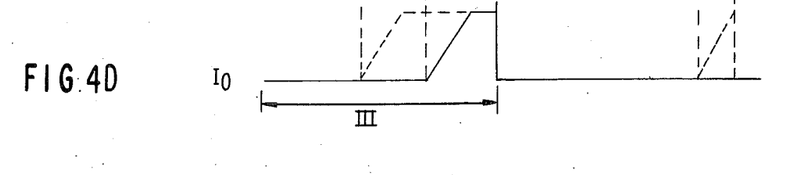

As a countermeasure for preventing such a missing pulse, the output voltage level of the comparator 4 must be raised to the level $V_4'$ as indicated by a dash line in FIG. 4B such that a sufficient output current may be obtained even upon the occurrence of the abnormal duty ratio in the time interval I as indicated in FIG. 4A. According to this countermeasure, since the output $V_5$ of the AND circuit 5 can be obtained in the form shown by a dash line in FIG. 4C, the occurrence of a missing pulse will be prevented as shown by a dash line in FIG. 4D. However, even when the rotation becomes smooth as a result of the temperature rise such that a normal input signal $V_1$ having a predetermined duty ratio is reapplied, since the comparison level $V_4'$ issued from the comparator circuit 4 is set at a high level as a countermeasure against a missing pulse, the flow period of the output current $I_0$ becomes very long as shown in a time interval III in FIG. 4D. In other words, the output circuit 7 generates both considerable heat and unnecessary current.

A semiconductor integrated control circuit chip can be obtained by circuit integration of the circuit portion excluding the output circuit 7. This integrated control circuit chip is mounted along with an output transistor chip of the output 7 and externally mountable passive elements such as capacitors, resistors, etc. on a single substrate as a hybrid integrated circuit. However, the junction temperature of such a semiconductor integrated circuit is liable to be influenced by heat generation due to electric power consumption of the output transistors. Accordingly, in order to maintain the junction temperature of the semiconductor integrated circuit chip below the tolerable junction temperature (especially under a high temperature condition caused by the heat from the output circuit 7) narrow design constraints must be imposed upon the thermal design of the thermal resistor and the like between the output transistor chip and the hybrid integrated circuit substrate, especially when the design must also account for the severe environmental conditions such as the ignition device of the internal combustion engine.

The increase and decrease in the duty ratio of the input signal pulse $V_1'$ in alternate cycle periods as shown in FIG. 3B only occurs in the case of very low operating temperatures where the viscosity of engine oil becomes high. At high operating temperatures, since the engine rotation becomes smooth, a normal input signal pulse $V_1$ occurs as shown in FIG. 3A and thereby a predetermined duty ratio can be obtained. In other words, at high temperature there is no need to increase the duty ratio of the output current $I_0$ (which is done as a countermeasure against a missing pulse as described above). However, in the prior art circuit arrangement as illustrated in FIG. 1, the duty ratio of the output current $I_0$ is enlarged (in view of this countermeasure against a missing pulse occurring at a low temperature) over the entire operating temperature range.

DETAILED DESCRIPTION OF THE INVENTION

An ignition system for an internal combustion engine according to one preferred embodiment of the present invention will be described with reference to FIG. 5. The ignition system shown in FIG. 5 comprises, in addition to the circuit blocks contained in the system shown in FIG. 1, a temperature detector 12 and a control circuit 13. The temperature detecting circuit 12 is provided for the purpose of detecting the operating temperature of the ignition system. In the case where many circuit blocks including the temperature detector circuit 12 are constructed in the form of a semiconductor integrated circuit, the junction temperature (i.e., the operating temperature) of the semiconductor devices is detected. When the operating temperature is at a level such that the rotation of the engine becomes smooth (and an input signal pulse $V_1$ having a predetermined duty ratio is supplied to the system), the temperature detector 12 detects this temperature level and supplies a detection output to the control circuit 13. Prior to the supply of the detection output from the temperature detector circuit 12, the comparison level $V_4'$ shown by the dash line in FIG. 4B is derived from the comparator 4 in order to prevent a missing pulse. However, when the above-mentioned detection output has been supplied from the temperature detector circuit 12, the control circuit 13 is activated. The control circuit 13 controls the charging/discharging waveform derived from the comparator 4 to lower it to the level of the comparison level $V_4$ shown by the solid line in FIG. 4B. As a result, in response to an input signal pulse $V_1$ having a predetermined duty ratio, the undesired extension of the supply period of the output current $I_0$ as shown in the time interval III in FIG. 4D can be prevented. The above-described operations will become more apparent by reference to FIG. 6 which discloses a more detailed circuit arrangement for each circuit block included in the system shown in FIG. 5.

Figure 5:
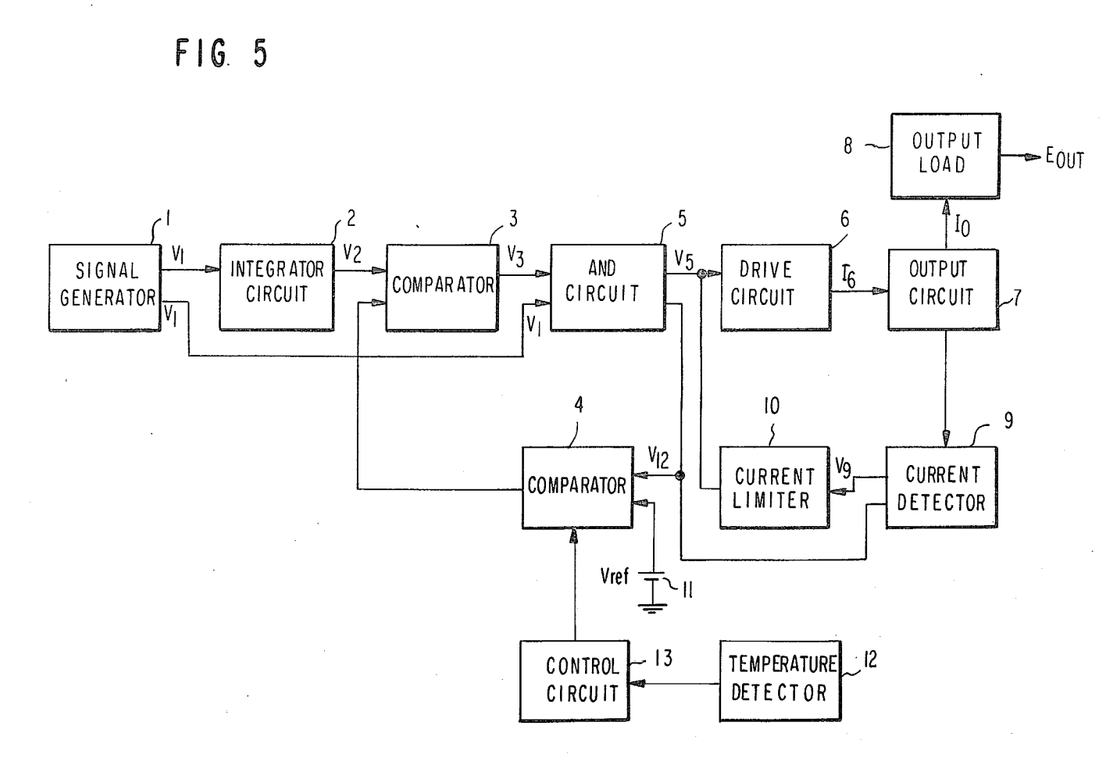
FIG. 5 is a block diagram showing an ignition system for an internal combustion engine according to one preferred embodiment of the present invention.
Figure 6:
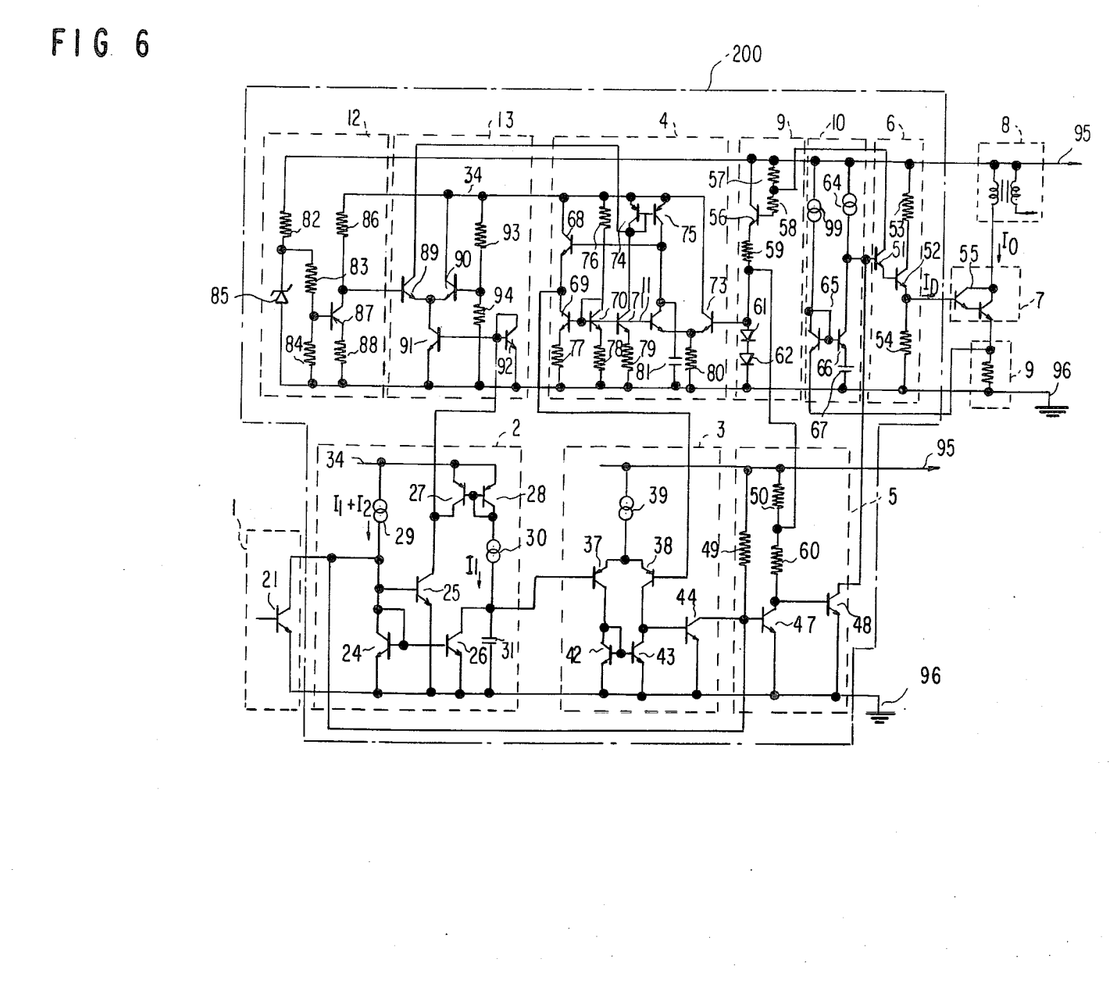
FIG. 6 is a circuit diagram showing in greater detail the circuit arrangement of a block form in FIG. 5, FIG. 7A to FIG. 7G are signal waveform diagrams to be used for explaining the operation of the system shown in FIGS. 5 and 6.

In FIG. 6, components equivalent to those shown in FIG. 5 are given like reference numerals. A signal generator 1 comprises a hole sensor (not shown) contained in a distributor (not shown), and it generates a pulse output $V_1$ synchronized with the rotation of an internal combustion engine with the aid of the hole sensor. A transistor 21 in the signal generator 1 amplifies the output derived from the hole sensor and applies the pulse output $V_1$ to the next stage.

An integrator circuit 2 is composed of transistors 24, 25, 26, 27 and 28, constant current sources 29 and 30, and a capacitor 31. The transistors 24 and 26 and transistors 27 and 28, respectively, form current-mirror circuits. The constant current source 29 feeds a constant current of $(I_1+I_2)$, and the constant current source 30 feeds a constant current of $I_1$. Reference numeral 34 designates a constant voltage power supply line. The integrator circuit 2 convert the pulse output $V_1$ derived from the signal generator 1 into a sawtooth signal $V_2$.

A comparator 3 compares the output voltage $V_2$ of the integrator circuit 2 with an output waveform $V_4$ of a comparator 4 as will be described later, and it is composed of transistors 37, 38, 42, 43 and 47 and a constant current source 39. The transistors 37 and 38 jointly form a differential amplifier, and the constant current source 39 serves as a constant current source for this differential amplifier. The transistors 42, 43 and 44 form an active load for the differential amplifier, and especially the transistors 42 and 43 jointly form a current-mirror circuit.

An AND circuit 5 generates a logical product of a pulse waveform $V_1$ generated from the signal generator 1 provided with a hole sensor and an output pulse waveform $V_3$ derived from the comparator circuit 3. This circuit 5 is composed of resistors 49, 50 and 60 and transistors 47 and 48. A drive circuit 6 is supplied with the output pulse from the AND circuit 5, and it is composed of transistors 51 and 52 and resistors 53 and 54.

An output circuit 7 is normally composed of a Darlington structure of transistors 55, which is connected to an ignition coil 8 as an output load.

A current detector 9 serves to detect a current value and the current limiting state of the output current $I_0$ flowing through the output circuit 7, and it is composed of a transistor 56, resistors 57, 58 and 59 and diodes 61 and 62 for detecting the current limiting state, and a resistor 63 for detecting the output current value.

A current limiter circuit 10 maintains the output current $I_0$ at a predetermined value in response to a detection output from the current detector 9. The detector 9 produces the detection output when it has detected that the output current $I_0$ flowing through the output current 7 has reached the predetermined value. The current limiter circuit 10 is composed of constant current sources 99 and 64, a reference voltage source 67, and transistors 65 and 66 which jointly form a current-mirror circuit.

A comparator 4 has the output pulse of the current detector circuit 9 applied to its input. The output voltage of the comparator 4 is applied to one input of the comparator circuit 3 to regulate a duty ratio of the output current from the output circuit 7 in accordance with the rotation speed of an internal combustion engine. The comparator 4 is composed of transistors 68 to 75, resistors 76 to 80, and a capacitor 81. The transistors 69, 70, 71 and 72 and the transistors 74 and 75, respectively, form current-mirror circuits, and the transistors 72 and 73 jointly form a differential amplifier. The collector or base voltage (the collector and the base being short-circuited to each other) of the transistor 70 forming a current-mirror circuit serves as a reference voltage of the comparator circuit 4.

A temperature detector circuit 12 detects the junction temperature (operating temperature) in the semiconductor integrated circuit encircled by a chain line frame 200, and is composed of resistors 82, 83, 84, 86 and 88, a Zener diode 85, and a transistor 87.

A control circuit 13 serves to lower the output voltage level of the comparator circuit 4 to reduce a duty ratio of the output current $I_0$ when the temperature detector circuit 12 detects the fact that the junction temperature in the integrated circuit 200 has reached the predetermined temperature. This circuit 13 is composed of transistors 89, 90, 91 and 92, and resistors 93 and 94. The transistors 89 and 90 jointly form a differential amplifier, and the transistors 91 and 92 form a current-mirror circuit. Reference numeral 95 designates one power supply terminal and reference numeral 96 designates the other power supply terminal which is grounded.

FIG. 7 shows voltage or current waveforms at various representative points in the circuit shown in FIG. 6. The operation of the circuit in FIG. 6 will be described with reference to FIG. 7.

Figure 7A:
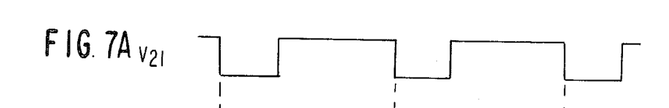

Generated from the collector of the output transistor 21 in the signal generator 1 is a pulse waveform $V_{21}$ synchronized with the rotation of an internal combustion engine as shown in FIG. 7A. This pulse waveform $V_{21}$ is applied to the integrator circuit 2. When the collector of the transistor 21 is at a low lever, the transistors 24 and 26 forming a current-mirror circuit are cut off. Accordingly, the capacitor 31 is charged by the constant current $I_1$ supplied from the constant current source 30. In the event that the collector of the transistor 21 is at a high level, the transistors 24 and 26 forming the current-mirror circuit become conductive and the constant current of $(I_1+I_2)$ flows through the collector of the transistor 26, so that the capacitor 31 is discharged by the constant current of $I_2$. Consequently, a charging/discharging waveform $V_{31}$ of the capacitor 31 takes the form represented by a solid line in FIG. 7B.

The charging/discharging waveform $V_{31}$ of the capacitor 31 is applied to the base of the transistor 37 as one input signal to the comparator 3. The other input signal to the comparator circuit 3 is obtained from the output of the comparator 4 as will be described later. The comparator 3 compares the charging/discharging waveform $V_{31}$ of the capacitor 31 with the output waveform $V_4$ of the comparator 4. In the event that the charging/discharging waveform $V_{31}$ of the capacitor 31, that is, the base voltage of the transistor 37, is higher than the output waveform $V_4$ of the comparator 4, that is, the base voltage of the transistor 38, the transistor 37 forming the differential amplifier is cut off, while the transistor 38 becomes conductive. Consequently, the transistors 42 and 43 forming a current-mirror circuit are cut off, hence the transistor 44 becomes conductive to takes a low collector level. On the other hand, in the event that the base voltage of the transistor 37 is lower than the base voltage of the the transistor 38, the transistor 42 and 43 forming a current-mirror circuit become conducting. Accordingly, the transistor 44 is cut off and its collector takes a high level. As a result, if the base input voltage $V_{38}$ of the transistor 38 is as indicated by a single-dot chain line in FIG. 7B, then the collector output $V_{44}$ of the transistor 44 takes the waveform shown in FIG. 7C.

This output signal $V_{44}$ serves as one input to the AND circuit 5. The other input to the AND circuit 5 is the collector output waveform $V_{21}$ of the transistor 21 shown in FIG. 7A. Hence, the AND circuit 5 generates a logical product of the collector waveform $V_{44}$ of the transistor 44 and the collector waveform $V_{21}$ of the transistor 21, and the output $V_{48}$ of the AND circuit 5 (i.e., the collector waveform of the transistor 48) presents the waveform shown in FIG. 7D.

The transistor waveform $V_{48}$ of the collector 48 serves as an input to the drive circuit 6, that is, it is applied to the base of the transistor 51 in the drive circuit 6. When the output $V_{48}$ of the AND circuit 5 is at a low level, the transistors 51 and 52 are cut off, so that the output current $I_0$ would not flow through the output circuit 7. On the other hand, when the output $V_{48}$ of the AND circuit 5 is turned to a high level, the transistors 51 and 52 become conducting, and therefore, to the base of the Darlington transistors 55 forming the output circuit 7 is fed a current $I_D$ determined by the voltage at the power supply terminal 95, the base-emitter voltage of the transistor 55, the collector-emitter saturation voltage of the transistor 52 and the resistance of the resistor 53. The current detecting resistor 63 can be neglected because its resistance is very small. When the output circuit 7 is driven by the drive circuit 6, the output current $I_0$ flowing through the Darlington transistor 55 increases gradually with a time constant determined by the inductance and resistance of the primary winding of the ignition coil 8. The current value flowing through the ignition coil 8 is detected as a voltage drop across the current detecting resistor 63 in the current detector circuit 9, and the detected voltage signal is input to the current limiter circuit 10.

Figures 7B, 7C:
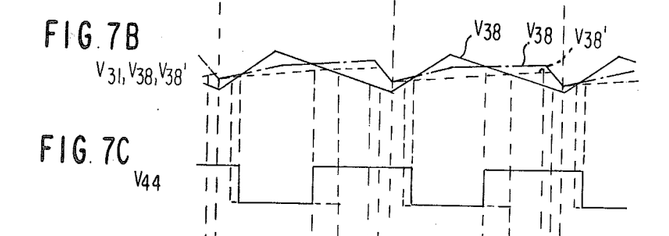
Figure 7D:
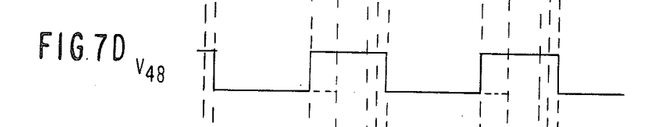
Figure 7E:
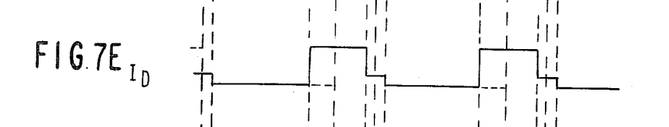
Figure 7F:
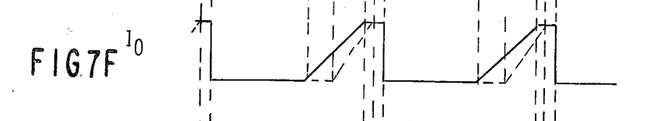

As the output current $I_0$ of the output circuit 7 increases gradually, the voltage across the current detecting resistor 63, that is, the emitter voltage of the transistor 65 becomes equal to the emitter voltage of the transistor 66 (i.e., the reference voltage 67) and the current flowing from the constant current source 99 into the transistor 65 decreases while the current flowing into the transistor 66 increases. Accordingly, in order that the transistor 66 can be fully driven, the constant current fed from the constant current source 64 flowing into the base of the transistor 51 in the drive circuit 6 is decreased, while the current from constant current source 64 flowing into the transistor 66 is increased. Hence, the current $I_D$ flowing through the transistor 52 in the drive circuit 6 decreases, and as a result, the output current $I_0$ is subjected to current limitation. The limitation of the output current $I_0$ to a predetermined value is set depending upon the current detecting resistor 63 and the reference voltage 67. Such a state is shown in FIGS. 7E and 7F.

In the current detector circuit 9, in the case of the output current $I_0$ being zero, since the output $V_{48}$ (at the collector of the transistor 48) of the AND circuit 5 is at a low level, the diodes 61 and 62 are conductive via the resistor 50, so that the base of the transistor 73 takes a high level. In addition, before the output circuit 7 becomes conductive to limit the output current $I_0$, since the transistor 51 is fully driven, the diodes 61 and 62 are conductive via the resistor 57 and 58 and the transistor 56. When the current limitation becomes effective, since the collector current of the transistor 51 decreases, the transistor 56 is cut off, and hence the diodes 61 and 62 are also cut off. In other words, the output of the current limiter circuit 9 presents a pulse waveform $V_{73}$ which takes a low level only when the output current $I_0$ is in the current limiting state (FIG. 7G).

Figure 7G:
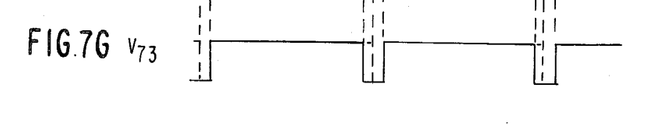

The comparator 4 has the pulse waveform $V_{73}$ shown in FIG. 7G applied to its input. When the base of the transistor 73 is at a high level, the transistor 72 is cut off, and therefore, the current fed from the transistors 74 and 75 which form a current mirror circuit serves to charge the capacitor 81. On the other hand when the base of the transistor 73 is at a low level, the transistor 73 is cut off and the transistor 72 becomes conducting, so that the electric charge in the capacitor 81 is discharged through the transistor 72 and the resistor 80. This charging/discharging waveform across the capacitor 81 is applied via the transistor 68 to one input of the comparator circuit 3 (to the base of the transistor 38) as a comparison level $V_{38}$ to regulate a duty ratio of the output current $I_0$ in the above-described manner. Furthermore, in order to prevent the above-described occurrence of the missing pulse upon very low temperature, the charging/discharging waveform $V_{48}$ at the output of the comparator 4 is raised, as a whole, up to the level shown by the chain line $V_{38}$ in FIG. 7B by regulating the charging current as well as the time constant for charging and discharging.

Here, the parameters of the Zener diode 85 and resistors 83 and 84 for setting the operating point of the transistor 87 are selected so that at a junction temperature (operating temperature) in the semiconductor integrated circuit 200 that is lower than a predetermined temperature, the transistor 87 operable as a temperature sensor may be cut off. Therefore, the base of the transistor 89 forming a differential amplifier will take a high level at a temperature lower than the predetermined set temperature, so that the transistor 89 becomes conductive. The transistors 91 and 92 jointly form a current-mirror circuit to serve as a current source for the differential amplifier composed of the transistors 89 and 90, and these transistors 91 and 92 become conducting via the transistors 27 amd 28 forming the current-mirror circuit only when the collector of the output transistor 21 in the signal generator 1 is at a low level. Accordingly, when the transistor 89 forming the differential amplifier becomes conducting, the current flowing through the current mirror circuit consisting of the transistors 74 and 75 in the comparator circuit 4 becomes equal to the sum of the current flowing through the current-mirror circuit composed of the transistors 70 and 71 and the resistors 76, 78 and 79 and the current flowing through the transistor 89. Capacitor 81 is charged by this sum current. When the transistor 21 in the signal generator 1 issues a collector output $V_{21}$ at a high level, the transistor 25 is turned ON, and hence the transistors 91 and 92 are turned OFF. Consequently, the capacitor 81 is charged by the current determined by the transistors 70 and 71, and the resistors 76, 78 and 79. Therefore, the charging voltage waveform across the capacitor 81 (the base voltage $V_{38}$ of the transistor 38) has two different slopes as shown in FIG. 7B. The slopes of the charging voltage of the capacitor 81 (upon temperatures above and below the predetermined value) are equal to each other to achieve the easy control of the output current width.

When the junction temperature of the semiconductor integrated circuit 200 becomes higher than a predetermined temperature, a voltage across the Zener diode 85 having a positive temperature coefficient (normally +2 mV/°C.) increases, whereas the base-emitter voltage of the transistor 87 has a negative temperature coefficient (normally −2 mV/°C.), and therefore, the transistor 87 becomes conducting. Accordingly, the collector of the transistor 87 takes a low level, and hence the transistor 89 forming a differential amplifier is cut off. As a result, the current flowing through the current-mirror circuit composed of the transistors 74 and 75 in the comparator circuit 4 is reduced. In other words, the capacitor 81 is charged by the current determined by the transistors 70 and 71, and resistors 76, 78 and 79. Therefore, the charging current for the capacitor 81 is reduced, and the voltage level across the capacitor 81 is also reduced. As a result, the base voltage level of the input transistor 38 in the comparator circuit 3 also decreases as indicated by a dash line $V_{38}'$ in FIG. 7B, and hence the duty ratio of the output current $I_0$ also decreases as indicated by a dash line in FIG. 7F.

In the illustrated embodiment, the junction temperature (operating temperature) at which the duty ratio of the output current $I_0$ is to be reduced, was designed to be 30 to 40° C. These values were designed taking into consideration the fluctuations in the resistances of the semiconductor resistors and the temperature coefficients of the transistor 87 and the Zener diode 85 and the temperature at which the increased viscosity of the engine oil can be recovered. For the purpose of operating at the junction temperature of 30 to 40° C., a Zener diode 85 having a Zener voltage of 5.6 V was used, and the resistances of the resistors 83, 84 and 88 are at 10 KΩ, 1.7 KΩ and 560Ω, respectively. It is to be noted that the resistor 88 is inserted for the purpose of regulating the sensitivity in the operation of reducing the duty ratio of the output current $I_0$ by controlling the current flowing through the resistor 88.

Shown in FIG. 7B by a dashed line is a base voltage waveform $V_{38}'$ of the transistor 38 which is produced upon the temperature of operation being higher than a predetermined temperature. The decrease of the duty of the output current $I_0$ owing to this lowered base voltage waveform $V_{38}'$ is also illustrated by dash lines in FIGS. 7D, 7E and 7F.

As described in detail above, when the junction temperature in the semiconductor integrated circuit 200 forming the circuit according to the present invention has risen to a certain temperature level, the temperature detector circuit 12 and the control circuit 13 operate to control the feedback loop for reducing the duty ratio of the output current $I_0$ flowing through the output circuit 7. Consequently the electric power consumption is reduced abruptly at the predetermined junction temperature. Therefore, when the circuit according to the present invention is formed of a thick-film hybrid integrated circuit, the thermal design thereof is not constrained in the manner as previously described.

Figure 8:
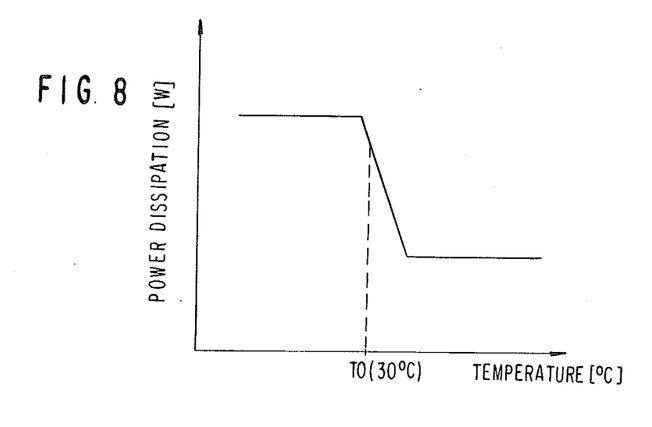
FIG. 8 is a diagram showing a relation of electric power consumption versus junction temperature realized by the circuit shown in FIG. 6, and FIGS. 9 to 11 are circuit diagrams partly showing other preferred embodiments of the present invention.

FIG. 8 shows the relation of electric power consumption versus a temperature. From FIG. 8, it is clear that the effect of the present invention is attained at a temperature higher than a predetermined set temperature $T_0$ (30° C. in the illustrated embodiment). The slope of the decreasing power consumption can be regulated by adjusting the above-described resistor 88. When the resistance of the resistor 88 is 0Ω, the slope becomes infinity.

Figure 9:
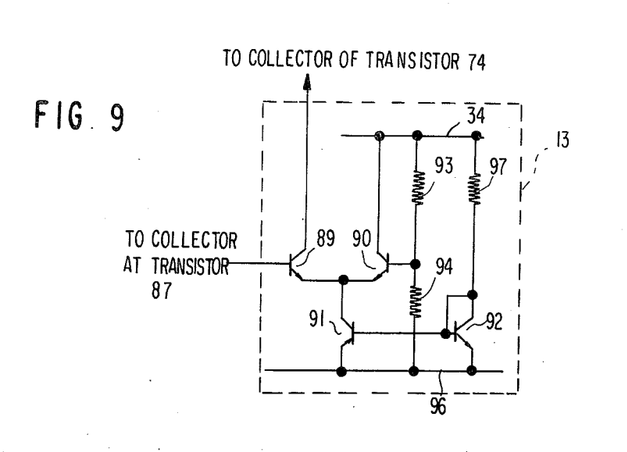

FIG. 9 shows another preferred embodiment of the control circuit 13 according to the present invention. In the first preferred embodiment shown in FIG. 6, the circuit was constructed such that the current flowing through the constant current source (the current-mirror circuit consisting of the transistors 91 and 92) for the differential amplifier (transistors 89 and 90) forming the control circuit 13 can conduct only in the event that the collector of the output transistor 21 forming a signal generator 1 is at a low level. In the modified embodiment shown in FIG. 9, the collector (or base) of the transistor 92 is connected via a resistor 97 to the power supply line 34 so that the constant current source may be always kept conducting. By making use of this modified embodiment, the effects of the present invention can be enhanced.

Figure 10:
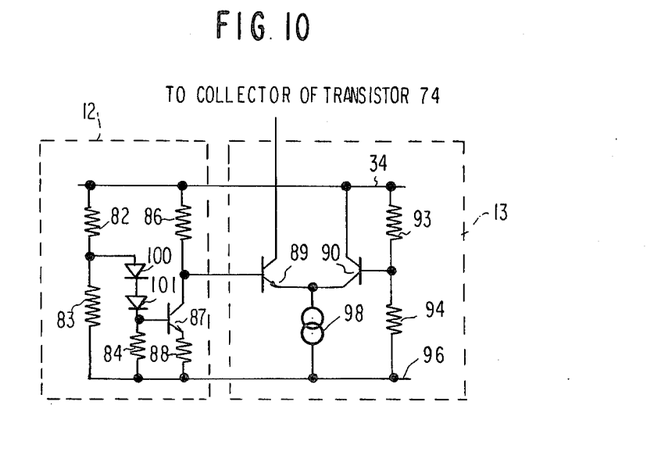

FIG. 10 shows another preferred embodiment of the temperature detector 12 according to the present invention. In the first preferred embodiment illustrated in FIG. 6, the Zener diode 85 having a positive temperature coefficient was employed in the temperature detector circuit 12. In in the modified embodiment as shown in FIG. 10, a plurality (two in the illustrated embodiment) of diodes 100 and 101 having a negative temperature coefficient are serially connected between the resistors 82 and 84, and the junction between the resistor 82 and the diode 100 is grounded via a resistor 83. In such a modified embodiment, when the junction temperature in the semiconductor integrated circuit 200 becomes higher than a predetermined value, the transistor 87 becomes conducting owing to a negative temperature coefficient of the forward voltage across the diodes 100 and 101, and hence the collector of the transistor 87 takes a low level. Consequently, the transistor 89 in the differential amplifier forming the control circuit 13 is turned OFF, and the other transistor 90 is turned ON.

Therefore, the effect and advantage of the present invention can be achieved as described previously.

In the above description, the temperature detector circuit 12 was explained with respect to the case where it is provided on the same semiconductor integrated circuit substrate. However, depending upon the operating condition and the use of the apparatus embodying the present invention, it is also possible that the temperature detector circuit 12 is thermally coupled to an output transistor and the predetermined pulse width control is effected in accordance with the thermal operating condition of the output transistor. Furthermore, it is also possible that the temperature detector 12 or only the temperature sensor portion (the transistor 87) in FIG. 6 is separated from the circuit arrangement shown in FIG. 6 so as to effect the predetermined pulse width control in response to detection of, for example, the environmental temperature (as opposed to the temperature of the circuit elements).

Figure 11:
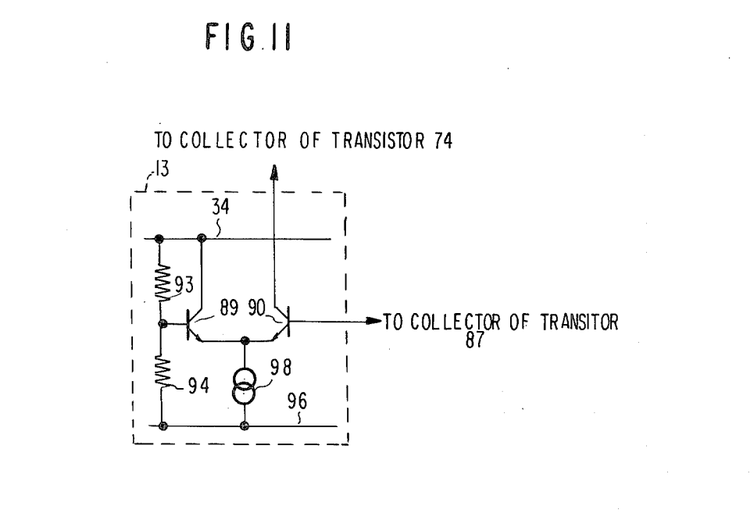

It is also possible to achieve pulse width control in the opposite direction to that described with reference to FIG. 6 by reversing the base voltage input arrangement for the transistors 89 and 90 forming the differential amplifier shown in FIG. 10 in the manner shown in FIG. 11, and thus the pulse width control characteristics according to the present invention can be arbitrarily set according to the requirement of the system in which the invention is practiced without being limited to the application to an ignition system for an internal combustion engine. In other words, the pulse width control can be effected in such maner that a duty ratio of an output current is held large up to a predetermined operating temperature but it is made small at a temperature exceeding the predetermined operating temperature. Furthermore various temperature sensors such as the thermistors, varistors, etc. can be used in the present invention. Finally, in place of the hole sensor, a pick-up coil could be employed for deriving an input pulse signal synchronized with the rotation of an internal combustion engine.

What is claimed is:

1. A combination, comprising means for generating a first signal having a variable cycle period, means for providing a second signal having a predetermined level, means responsive to said first and second signals for producing pulse signals having a predetermined pulse width corresponding to said variable cycle period of said first signal, means for detecting an operating temperature and being responsive to the detected operating temperature to create a detection signal representing that said operating temperature is lower than a predetermined temperature, and means responsive to said detection signal for changing the level of said second signal from said predetermined level to another level, whereby said producing means produces a pulse signal having a pulse width different from said predetermined pulse width when said operating temperature is lower than said predetermined temperature.

2. The combination as claimed in claim 1, further comprising means responsive to said pulse signal for supplying a current, said providing means providing said second signal in response to said supplied current, whereby said second signal has said predetermined level in response to said predetermined pulse width of said pulse signal.

3. The combination as claimed in claim 1, wherein said detecting means comprises switching means, said switching means being non-conductive when said operating temperature is lower than said predetermined temperature.

4. An ignition system for an internal combustion engine comprising an input circuit providing an input signal synchronized with the rotation of said internal combustion engine, an ignition coil generating an ignition energy, an output circuit feeding a current through said ignition coil, a feedback circuit producing a feedback signal in response to a current flowing through said ignition coil, a signal supply circuit supplying to said output circuit a signal for controlling a current supply period of time to said ignition coil in response to said input signal and said feedback signal, a detection circuit detecting an operating temperature of said internal combustion engine and producing a detection output, said detection output taking a first value when said operating temperature is lower than a predetermined temperature and a second value when said operating temperature is equal to or higher than said predetermined temperature, and a control circuit increasing the level of said feedback signal from a first level to a second level in response to said first value of said detection output and decreasing said level of said feedback signal from said second level to said first level in response to said second value of said detection output, said current supply period of time to said ignition coil becoming longer than a predetermined period of time in response to said second level of said feedback signal, said current supply period of time to said ignition coil becoming equal to said predetermined period of time in response to said first level of said feedback signal.

5. The ignition system for an internal combustion engine as claimed in claim 4, wherein said detection circuit comprises a switching element provided with a threshold voltage having a first temperature-dependent characteristic and a bias circuit applying a bias voltage having a second temperature-dependent characteristic to said switching element, said first and second temperature-dependent characteristics being diffefent in polarity from each other.

6. The ignition system for an internal combustion engine as claimed in claim 5, wherein said threshold voltage of said switching element has a negative temperature coefficient and said bias voltage has a positive temperature coefficient.

7. An ignition circuit for an internal combustion engine comprising a signal generator generating an input pulse signal synchronized with the rotation of said internal combustion engine, an integrator circuit having a first capacitor, said first capacitor being charged and discharged in response to said input pulse signal to produce a sawtooth signal, an ignition coil having a primary winding and a secondary winding for generating an ignition energy, a first semiconductor switching device connected in series to said primary winding of said ignition coil, a current detecting resistor connected in series to said first semiconductor switching device, a feedback circuit having a second capacitor, said second capacitor being charged and discharged in response to a voltage drop across said current detecting resistor to produce a feedback signal, a comparator having an inverting input end supplied with said sawtooth signal and a non-inverting input end supplied with said feedback signal, an AND circuit having first and second input ends supplied with said input pulse signal and an output signal of said comparator, respectively, and an output end coupled to a control electrode of said first semiconductor device to control a current supply period of time to said primary winding of said ignition coil through said first semiconductor switching device, a temperature detector including a second semiconductor switching device having a threshold voltage of one polarity temperature coefficient and a bias circuit supplying a bias voltage of the other polarity temperature coefficient to a control electrode of said second semiconductor switching device, said second semiconductor switching device being conductive when an operating temperature of said internal combustion engine is equal to or higher than a predetermined temperature, and a control circuit having a current suppressing circuit suppressing a current for charging said second capacitor, said current suppressing circuit operating when said second semiconductor switching device is turned on, whereby the level of said feedback signal is decreased so that said current supply period of time becomes short when said operating temperature becomes equal to or higher than said predetermined temperature.

8. The ignition circuit as claimed in claim 7, wherein said second semiconductor switching device is a transistor having a base as said control electrode, an emitter and a collector and said bias circuit has a Zener diode, said transistor having the threshold voltage of a negative temperature coefficient, said Zener diode generating a constant voltage of a positive temperature coefficient for supplying said bias voltage.

9. The ignition circuit as claimed in claim 7, wherein said control circuit having a first transistor serving as said current suppressing circuit and a second transistor cooperating with said first transistor to form a differential amplifier, said first transistor being turned off when said second semiconductor switching device is turned on.

10. The ignition circuit as claimed in claim 9, wherein said feedback circuit further has a current-mirror circuit and a current source, said current-mirror circuit having an output end connected to said second capacitor and an input end connected to said current source and the collector of said first transistor, whereby a current flowing into the input end of said current-mirror circuit is decreased to suppress a current flowing through the output end of said current-mirror circuit to said second capacitor when said first transistor is turned off.

11. A pulse width control circuit comprising means for generating an input signal, means responsive to said input signal for producing a sawtooth signal, comparing means for comparing said sawtooth signal with a comparison level, means for providing a pulse signal having a pulse width determined by said input signal and an output of said comparing means, means responsive to said pulse signal for supplying a feedback signal having a first level to said comparing means as said comparison level, means for detecting an operating temperature to produce a detection signal representing that said operating temperature is equal to or higher than a predetermined temperature, and means cooperating with said supplying means for changing the level of said feedback signal from said first level to a second level in response to said detection signal, said first level being selected such that said pulse signal has a pulse width different from a predetermined pulse width, said second level being selected such that said pulse signal has said predetermined pulse width.

* * * * *

UNITED STATES PATENT AND TRADEMARK OFFICE
CERTIFICATE OF CORRECTION

PATENT NO. : 4,469,082

DATED : September 4, 1984

INVENTOR(S) : Shigeo NISHITOBA, Hirokazu FUKAYA,

It is certified that error appears in the above-identified patent and that said Letters Patent is hereby corrected as shown below:

Column 1, line 21, insert a --,-- after "specifically";
         line 21, insert --the-- before "cycle";
         line 53, "abovementioned" should be --above mentioned--.

Column 2, line 54, insert --operating-- after "high--.

Column 4, line 24, "coinicdent" should be --coincident--;
         line 55, delete "called current limiting state" and insert --called a "current limiting state")--.

Column 8, line 67, "lever" should be --level--.

Column 12, line 54, delete "in" (second occurrence).

Column 13, line 31, "maner" should be --manner--.

Column 14, line 39, "different" should be different--.

Signed and Sealed this

Thirty-first Day of December 1985

[SEAL]

Attest:

DONALD J. QUIGG

Attesting Officer     Commissioner of Patents and Trademarks